United States Patent
Ishiguro et al.

(10) Patent No.: US 9,758,690 B2
(45) Date of Patent: Sep. 12, 2017

(54) TRANSPARENT RESIN COMPOSITION FOR SEALING ORGANIC ELECTROLUMINESCENCE ELEMENT, RESIN SHEET FOR SEALING ORGANIC ELECTROLUMINESCENCE ELEMENT, AND APPARATUS FOR DISPLAYING IMAGE

(71) Applicant: FURUKAWA ELECTRIC CO., LTD., Tokyo (JP)

(72) Inventors: Kunihiko Ishiguro, Tokyo (JP); Tetsuya Mieda, Tokyo (JP); Keiji Saito, Tokyo (JP); Masami Aoyama, Tokyo (JP); Toshimitsu Nakamura, Tokyo (JP); Naoaki Mihara, Tokyo (JP); Takumi Asanuma, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/750,577

(22) Filed: Jun. 25, 2015

(65) Prior Publication Data

US 2015/0291824 A1 Oct. 15, 2015

Related U.S. Application Data (63) Continuation-in-part of application No. PCT/JP2013/084303, filed on Dec. 20, 2013.

(30) Foreign Application Priority Data

Dec. 25, 2012 (JP) ................. 2012-281397

(51) Int. Cl.
| | |
|---|---|
| C09D 125/08 | (2006.01) |
| C09D 193/04 | (2006.01) |
| C09D 109/06 | (2006.01) |
| C09D 123/22 | (2006.01) |
| C08K 5/01 | (2006.01) |
| C08K 5/56 | (2006.01) |
| C08K 5/057 | (2006.01) |
| C08K 5/00 | (2006.01) |
| C08L 53/02 | (2006.01) |
| H01L 51/52 | (2006.01) |

(52) U.S. Cl.
CPC .......... *C09D 125/08* (2013.01); *C08K 5/0091* (2013.01); *C08K 5/01* (2013.01); *C08K 5/057* (2013.01); *C08K 5/56* (2013.01); *C08L 53/025* (2013.01); *C09D 109/06* (2013.01); *C09D 123/22* (2013.01); *C09D 193/04* (2013.01); *H01L 51/524* (2013.01)

(58) Field of Classification Search
CPC .. C09D 125/08; C09D 123/22; C09D 193/04; C09D 109/06; C08K 5/56; C08K 5/01
USPC ....................... 524/301, 274, 397
See application file for complete search history.

(56) References Cited

U.S. PATENT DOCUMENTS

| | | | |
|---|---|---|---|
| 6,790,381 B2 | 9/2004 | Tsuruoka et al. | |
| 2003/0110981 A1 | 6/2003 | Tsuruoka et al. | |
| 2008/0194773 A1* | 8/2008 | Wakioka ............. | C08G 65/336 |
| | | | 525/431 |
| 2008/0220245 A1 | 9/2008 | Suzuki et al. | |
| 2012/0037893 A1 | 2/2012 | Tanaka et al. | |

FOREIGN PATENT DOCUMENTS

| | | |
|---|---|---|
| CN | 1864438 A | 11/2006 |
| CN | 102397779 A | 4/2012 |
| JP | 2003-142256 A | 5/2003 |
| JP | 2003-144830 A | 5/2003 |

(Continued)

OTHER PUBLICATIONS

Office Action issued on Aug. 30, 2013, corresponding Japanese patent application No. 2012-281397 English translation.

(Continued)

*Primary Examiner* — Deve E Valdez
(74) *Attorney, Agent, or Firm* — Oblon, McClelland, Maier & Neustadt, L.L.P.

(57) ABSTRACT

A transparent resin composition for sealing an organic EL element and other things having a sufficient effect of blocking moisture and excellent flexibility is provided. As essential components, a thermoplastic resin, tackifying resin and organometallic compound represented by the following chemical formula are included, having a light transmittance of 85% or more, and having a relationship of AM/Y<162, A: the acid value excluding the organometallic compound M: the weight average molecular weight of the organometallic compound Y: the weight ratio of the organometallic compound with respect to 100 parts by weight of resin components

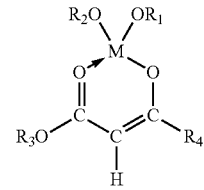

wherein the thermoplastic resin contains a hydride of a styrene-based A-B-A type triblock, wherein R1 to R4 represent organic groups including an alkyl group, aryl group, alkoxy group, cycloalkyl group and acyl group, each having a carbon number of 1 or more and 8 or less, M represents a metal atom having 3 valency.

8 Claims, 2 Drawing Sheets

(56) References Cited

FOREIGN PATENT DOCUMENTS

| JP | 4475084 | 3/2010 |
|----|---------|--------|
| JP | 2010-080293 A | 4/2010 |
| JP | 2012-038660 | 2/2012 |
| TW | 575654 | 10/1991 |

OTHER PUBLICATIONS

International Search Report in Japanese Patent Application No. PCT/JP2013/084303 in English.
Office Action issued on Feb. 9, 2015, corresponding to Taiwanese patent application No. 102147968 with English translation.
Combined Chinese Office Action and Search Report issued Jun. 2, 2016 in Patent Application No. 201380068119.6 (with Partial English translation and English translation of categories of cited documents).

* cited by examiner

TRANSPARENT RESIN COMPOSITION FOR SEALING ORGANIC ELECTROLUMINESCENCE ELEMENT, RESIN SHEET FOR SEALING ORGANIC ELECTROLUMINESCENCE ELEMENT, AND APPARATUS FOR DISPLAYING IMAGE

TECHNICAL FIELD

The present invention relates to a transparent resin composition for sealing an organic electroluminescence element and a resin sheet for sealing an organic electroluminescence element, used for sealing a light emitting surface side of the organic electroluminescence element, and an apparatus for displaying an image.

BACKGROUND ART

In recent years, research has been actively done about various organic electronic devices such as an organic electroluminescence (hereinafter also referred to as "organic EL") display, organic EL illumination, organic semiconductor and organic solar battery, which are expected to become as a next generation display in place of a liquid crystal display (LCD) or a next generation illumination in place of a light emitting diode (LED) illumination. Furthermore, an organic EL element may be used as a flexible display or illumination, because all components of the organic EL element can be formed of solid materials. The organic EL element has such a basic structure that on a board made of glass or the like are sequentially formed an anode layer, a light emitting layer and a cathode layer, emits light by oneself by applying a voltage between the anode layer and the cathode layer, and allows the light to be extracted either through the anode layer or the cathode layer, so that the light emitting manner of the organic EL device includes a top emission type and a bottom emission type.

However, when moisture, an impurity or the like exists around the above mentioned organic EL element, a non-light emitting part referred to as a dark spot will be generated and grow up, and the non-light emitting part may be identified by the visual observation when the dark spot grows up to have a diameter of tens of micrometers, resulting in degradation for the visibility.

Accordingly, in order to block moisture, an impurity or the like from existing therearound, an organic EL device is disclosed, in which a transparent sealing board (or a sealing can in some cases) or the like made of glass or the like is included, and a space formed between the organic EL element and the sealing board is filled with a viscous material containing a dehydrating agent (for example, see Patent Literature 1). However, because it is necessary to use a dam material for such an organic EL device in order to prevent the viscous material from overflowing when the filling is performed, a flexible organic EL device cannot be obtained.

In order to produce a flexible organic EL device, a method for sealing with a transparent sealant made of a thermoplastic resin is disclosed (for example, see Patent Literature 2), however, the effect of blocking moisture is not sufficient.

CITATION LIST

Patent Literatures

Patent Literature 1: JP 2012-038660 A
Patent Literature 2: JP 4475084 B1

SUMMARY OF INVENTION

Technical Problem

Accordingly, it is an object of the present invention is to provide a transparent resin composition for sealing an organic electroluminescence element, a resin sheet for sealing an organic electroluminescence element, and an apparatus for displaying an image, having a sufficient effect of blocking moisture and excellent flexibility.

Solution to Problem

To achieve the above object, the present invention provides a transparent resin composition for sealing an organic electroluminescence element including as essential components: a thermoplastic resin; a tackifying resin; and an organic metallic compound represented by the following chemical formula (Chemical Formula 1), having a light transmittance of 85% or more through a thickness of 0.1 mm for a light having a wavelength of 550 nm, and having a relationship of AM/Y<162, when the acid value (mgCH$_3$ONa/g) except the organic metallic compound represented by the chemical formula (Chemical Formula 1) is represented as A, the weight average molecular weight of the organic metallic compound represented by the chemical formula (Chemical Formula 1) is represented as M, and the weight ratio of the organic metallic compound represented by the chemical formula (Chemical Formula 1) with respect to 100 parts by weight of resin components is represented as Y, wherein the thermoplastic resin contains a hydride of a styrene-based A-B-A type triblock. The AM/Y is preferably 0 or more and 161 or less.

[Chemical Formula 1]

(In the formula, R1 to R4 represent organic groups including an alkyl group, aryl group, alkoxy group, cycloalkyl group and acyl group, each having a carbon number of 1 or more and 8 or less, M represents a metal atom having 3 valency, and R1 to R4 may be the same or different organic groups to each other.)

In addition, in the transparent resin composition for sealing an organic electroluminescence element, the styrene-based A-B-A type triblock is preferably any one or a combination of a styrene-ethylene-butylene-styrene copolymer, styrene-ethylene-propylene-styrene copolymer, styrene-ethylene-ethylene-propylene-styrene copolymer and styrene-isobutylene-styrene copolymer.

In addition, in the transparent resin composition for sealing an organic electroluminescence element, the tackifying resin is preferably any one or a combination of a hydride of a C-5 petroleum resin, hydride of a C-9 petroleum resin, and hydride of a petroleum resin obtained through copolymerization of a C-5 petroleum resin with a C-9 petroleum resin.

In addition, to achieve the above object, the present invention provides a resin sheet for sealing an organic electroluminescence element, at least apart of the resin sheet being provided with a sealing layer formed of the transparent resin composition for sealing an organic electroluminescence element according to any of the above.

In addition, the present invention provides an apparatus for displaying an image at least including: an organic electroluminescence element; and a sealing board provided on a surface of the organic electroluminescence element, wherein the resin sheet for sealing an organic electroluminescence element according to claim 5 is laid between the organic electroluminescence element and the sealing board.

Advantageous Effects of Invention

The transparent resin composition for sealing an organic EL element and the resin sheet for sealing an organic electroluminescence element according to the present invention can have an excellent water absorptivity and low moisture permeability, block moisture from existing around the organic EL element, and suppress the dark spot generation. In addition, the apparatus for displaying an image according to the present invention can block moisture from existing around the organic EL element with the aid of the resin sheet for sealing an organic electroluminescence element, thereby suppressing the dark spot generation and thus improving the visibility of the image. In addition, the transparent resin composition for sealing an organic EL element according to the present invention has a flexibility, so that it is possible to fill a space between the organic EL element and the sealing board, and also possible to, when a flexible board is used for the sealing board and an element board of the organic EL element, have an effect of keeping the flexibility without being impaired. Furthermore, the transparent resin composition for sealing an organic EL element according to the present invention has an excellent transparency, so that even when the composition closely fits to a transparent member such as a sealing board of which a top emission type organic EL device is composed, the transparency will never decrease. As a result, the composition can be used regardless of the light emitting manner of an organic EL device.

DESCRIPTION OF EMBODIMENTS

Hereinafter, a detailed description is made of an embodiment of the present invention.

Figure 1:
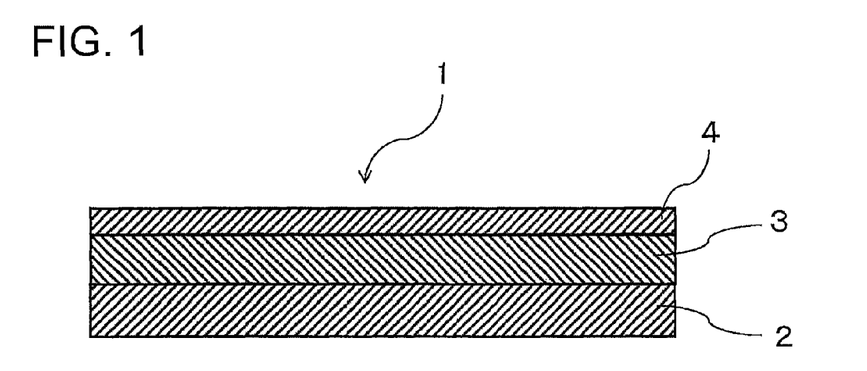
FIG. 1 illustrates a cross sectional view for schematically representing a structure of a resin sheet for sealing an organic electroluminescence element according to an embodiment of the present invention.

A resin sheet for sealing an organic electroluminescence element 1 according to an embodiment of the present invention has at least one sealing layer 3 that is formed on at least one side of a substrate sheet 2. FIG. 1 is a schematic sectional view to illustrate a preferred embodiment of the resin sheet for sealing an organic electroluminescence element 1 of the present invention. As illustrated in FIG. 1, the resin sheet for sealing an organic electroluminescence element 1 has the substrate sheet 2 on which a sealing layer 3 is formed. In addition, the resin sheet for sealing an organic electroluminescence element 1 further includes on the sealing layer 3 a releasing film 4 for protecting the sealing layer 3.

Hereinafter, a detailed description is made of each of the components of the resin sheet for sealing an organic electroluminescence element 1 of the embodiment.

(Substrate Sheet 2 and Releasing Film 4)

The substrate sheet 2 serves to allow a resin composition to temporarily adhere to the substrate sheet 2 for the purpose of making the handling property better when a resin composition composing the sealing layer 3 is formed in a film shape. In addition, the releasing film 4 is used for the purpose of protecting the sealing layer 3.

The substrate sheet 2 and the releasing film 4 are not limited particularly, and the examples thereof include a polyethylene film, polypropylene film, polybutene film, polybutadiene film, polymethylpentene film, polyvinylchloride film, vinylchloride copolymer film, polyethylene terephthalate film, polyethylene naphthalate film, polybutylene terephthalate film, polyurethane film, ethylene-vinyl acetate copolymer film, ionomer resin film, ethylene-(meth) acrylic acid copolymer film, ethylene-(meth)acrylic ester copolymer film, polystyrene film, polycarbonate film, polyimide film, fluororesin film, and the like. In addition, crosslinked films thereof are also used. Furthermore, layered films thereof may also be used. In particular, in the light of the cost, handling property and the like, it is preferable to use polyethylene terephthalate.

The peel force when the sealing layer 3 is peeled off from the substrate sheet 2 and the releasing film 4 is, for example, preferably 0.3 N/20 mm or less, more preferably 0.2 N/20 mm. The lower limit of the peel force is not particularly limited, but practically 0.005 N/20 mm or more. In addition, in order to make the handling property better, it is preferable to use the substrate sheet 2 and the releasing film 4 whose peel forces from the sealing layer 3 are different from each other.

The substrate sheet 2 and the releasing film 4 have a film thickness of generally from around 5 to around 300 μm, preferably from around 10 to around 200 μm, more preferably from around 20 to around 100 μm.

(Sealing Layer 3)

The transparent resin composition for sealing an organic electroluminescence element composing the sealing layer 3 contains as essential components a thermoplastic resin, tackifying resin, and organic metallic compound represented by the following chemical formula (Chemical Formula 1) as a desiccating agent,

[Chemical Formula 1]

wherein R1 to R4 represent organic groups including an alkyl group, aryl group, alkoxy group, cycloalkyl group and acyl group, each having a carbon number of 1 or more and 8 or less, and M represents a metal atom having 3 valency. In addition, R1 to R4 may be the same or different organic groups to each other.

[Thermoplastic Resin]

The thermoplastic resin includes a hydride of a styrene-ethylene-butylene-styrene copolymer, styrene-ethylene-propylene-styrene copolymer, styrene-ethylene-ethylene-propylene-styrene copolymer, and styrene-based A-B-A type triblock such as a styrene-isobutylene-styrene copolymer, styrene-isoprene-styrene copolymer and styrene-butadiene-styrene copolymer. The thermoplastic resin may be composed of a hydride of one kind of such a styrene-based A-B-A type triblock, or hydrides of several kinds of such styrene-based A-B-A type triblocks. In addition, another thermoplastic resin may be further included. Another thermoplastic resin is not particularly limited as long as the resin has a transparency, and includes a cycloolefin polymer and urethane-based thermoplastic elastomer resin, diblock or triblock rubber resin such as a styrene-butadiene block copolymer, styrene-isoprene block copolymer, styrene-ethylene-butene block copolymer and styrene-ethylene-propylene block copolymer, rubber such as polyisobutylene, butadiene and isoprene, and the like. It is preferable that they be hydrides.

Containing such a styrene-based A-B-A type triblock allows extending the range of the close fitness with respect to an organic EL element 6 (see FIGS. 2 and 3A to 3D) and of the choice of the tackifying resin. In addition, such a hydride improves the transparency and antiweatherability.

The A-B-A type block copolymer has a weight average molecular weight of the A block part of preferably from 1,000 to 500,000, and a weight average molecular weight of the B block part of preferably from 15,000 to 1,000,000. Here, the weight average molecular weight in the present invention was calculated based on a calibration curve that was generated in accordance with a gel permeation chromatography (GPC) measurement with the use of the polystyrene standard substance.

Because the above mentioned A-B-A type block copolymer may have too high tackiness to express the rubber elasticity when a styrene component is less than 10 mol %, the styrene component is preferably of 10 mol % or more. On the other hand, because the A-B-A type block copolymer may have too low tackiness, or get too hard to express the rubber elasticity when a styrene component is more than 40 mol %, the styrene component is preferably of 40 mol % or less.

The above mentioned A-B-A type block copolymer is marketed by and available from, for example, Zeon Corporation, AsahiKasei Chemicals Corporation, Kuraray Co., Ltd., JSR Corporation, Kaneka Corporation and the like.

[Tackifying Resin]

The tackifying resin is used for the purpose of providing a moderate viscosity and adhesive property. The tackifying resin includes a rosin, rosin derivative (a hydrogenated rosin, disproportionated rosin, polymerized rosin, rosin ester (such as a rosin esterified with alcohol, glycerin, pentaerythritol, ect)), terpene resin (α-pinene, β-pinene), terpene phenol resin, aromatic modified terpene resin, hydrogenated terpene resin, C-5 petroleum resin, C-9 petroleum resin, petroleum resin obtained through copolymerization of a C-5 petroleum resin with a C-9 petroleum resin, DCPD petroleum resin, hydride of a C-5 petroleum resin, hydride of a C-9 petroleum resin, hydride of a petroleum resin obtained through copolymerization of a C-5 petroleum resin with a C-9 petroleum resin, hydride of a DCPD petroleum resin, cumarone-indene resin, styrene-based resin, phenolic resin, xylene resin, and the like.

Among them, one or more types selected from the group consisting of a hydride of a C-5 petroleum resin, hydride of a C-9 petroleum resin, hydride of a petroleum resin obtained through copolymerization of a C-5 petroleum resin with a C-9 petroleum resin, hydride of a DCPD petroleum resin, hydrogenated rosin-based resin and hydrogenated terpene-based resin are preferably used, because they have a good compatibility with the above mentioned thermoplastic resin, thereby forming a resin composition having an excellent transparency. Among them, a hydride of a C-5 petroleum resin, hydride of a C-9 petroleum resin, hydride of a petroleum resin obtained through copolymerization of a C-5 petroleum resin with a C-9 petroleum resin are preferably used, because the steam barrier performance is good.

The softening point of the above mentioned hydride of a petroleum resin is preferably from 60 to 150° C. When the softening point is at less than 60° C., the cohesion force of the composition decreases, so that the retention property at high temperatures decreases. When the softening point is at more than 150° C., the fluidity of the composition decreases, so that the sealing property decreases.

The above mentioned hydride of a petroleum resin is marketed by and available from, for example, Arakawa Chemical Industries, Ltd., Idemitsu Kosan Co., Ltd. and the like.

[Desiccating Agent]

The desiccating agent is used for the purpose of capturing moisture passing through the resin composition. Capturing the moisture allows suppressing the degradation of the organic EL element 6 caused by the moisture. The desiccating agent includes, for example, a metal oxide such as calcium oxide, magnesium oxide and barium oxide, sulfate such as magnesium sulfate, sodium sulfate and nickel sulfate, organic metallic compound such as aluminum ethyl acetoacetates, and the like.

Among them, aluminum ethyl acetoacetates with a carbon number from 1 to 8 represented by Formula 1 are preferably used, because they can form a resin composition having an excellent transparency,

[Chemical Formula 1]

wherein R1 to R4 represent organic groups including an alkyl group, aryl group, alkoxy group, cycloalkyl group and acyl group, each having a carbon number of 1 or more and 8 or less, and M represents a metal atom having 3 valency. In addition, R1 to R4 may be the same or different organic groups to each other.

The above mentioned aluminum ethyl acetoacetates with a carbon number from 1 to 8 are marketed by and available from, for example, Kawaken Fine Chemicals Co., Ltd. and Hope Chemical Co., Ltd.

When the weight average molecular weight of the above mentioned desiccating agent is represented as M, the weight ratio of the desiccating agent with respect to 100 parts by weight of the resin components is represented as Y, and the acid value (mgCH$_3$ONa/g) of the transparent resin composition for sealing an organic EL element except the desiccating agent is represented as A, the value calculated by AM/Y may be less than 162. In addition, the value calculated by AM/Y may be 0 or more and 161 or less. When the value is 162 or more, the adjusted transparent resin composition for sealing an organic EL element gets thickened, so that a thin resin film will not be obtained. Here, the resin components correspond to all resin components contained in the transparent resin composition for sealing an organic EL element, such as a plasticizing agent, in addition to the above mentioned thermoplastic resin and the above mentioned tackifying resin.

[Plasticizing Agent]

The transparent resin composition for sealing an organic EL element may contain the plasticizing agent. Introducing the plasticizing agent allows modifying the fluidity. The plasticizing agent includes a wax, paraffin, phthalate ester, adipate ester, polybutene, and the like.

[Another Additive Agent]

The transparent resin composition for sealing an organic EL element may contain a silane coupling agent. Using the silane coupling agent increases the amount of chemical bond to the adherend, and improves the adhesive force. The silane coupling agent specifically includes a silane coupling agent such as 3-glycidoxypropyltrimethoxysilane, 3-glycidoxypropylmethyldimethoxysilane, 3-glycidoxypropylmethyldimethoxysilane, 2-(3,4-epoxycyclohexyl)ethyltrimethoxysilane, N-phenyl-γ-aminopropyltrimethoxysilane, N-(2-aminoethyl) 3-aminopropylmethyldimethoxysilane, N-(2-aminoethyl) 3-aminopropylmethyltrimethoxysilane, 3-aminopropyltriethoxysilane, 3-mercaptopropyltrimethoxysilane, vinyltrimethoxysilane, N-(2-(vinylbenzylamino) ethyl) 3-aminopropyltrimethoxysilane hydrochloride and 3-methacryloxypropyltrimethoxysilane, and the like. Two or more kinds of these silane coupling agents may be mixed. The content of the silane coupling agent is preferably from 0.05 to 10 parts by mass, more preferably from 0.1 to 1 part by mass with respect to 100 parts by mass of the resin composition.

As long as an object of the present invention can be achieved, the other components, for example a preservation stabilizing agent, antioxidizing agent, plasticizing agent, tack adjusting agent, resin stabilizing agent and the like, may be further added, however, attention is required because the visibility of an apparatus for displaying an image may be worsened by moisture or an impurity contained in those added components.

The transparent resin composition for sealing an organic EL element has a light transmittance of 85% or more through a thickness of 0.1 mm for a light having a wavelength of 550 nm. This is because when the light transmittance for a light having a wavelength of 550 nm is less than 85%, the visibility decreases. Selecting the resin allows selecting the light transmittance.

[Method for Measuring Light Transmittance]

The light transmittance may be obtained through measurement of the amount of transmitted light with the use of a spectrophotometer (made by Hitachi High-Technologies Corporation, spectrophotometer type U-4100, solid sample measuring system).

When the film-shaped sealing layer 3 is produced, the transparent resin composition for sealing an organic EL element may contain a solvent. Such a solvent includes an organic solvent of methyl ethyl ketone, toluene, ethanol or isopropanol, but methyl ethyl ketone or toluene is particularly preferable. In such a solvent, the individual materials to be included in the resin composition are added, then mixed and dispersed. The obtained resin solution may be applied onto the surface for peeling-off of the substrate sheet 2 directly or through transferring, in accordance with a generally and publicly known method such as a roll knife coater, gravure coater, die coater and reverse coater, and dried, with the result that the sealing layer 3 is obtained.

In addition, an approach for producing the film-shaped sealing layer 3 without using an organic solvent includes melting the transparent resin composition for sealing an organic EL element at high temperatures, extruding the melt with the use of a generally and publicly known approach such as a hot melt coater, and then cooling the extruded melt, thereby producing the sealing layer 3.

The sealing layer 3 has a thickness of preferably from 3 to 100 μm, more preferably from 5 to 50 μm.

In addition, it is more preferable that the sealing layer 3 and a target to be glued to and in contact with the sealing layer 3 have a surface roughness Ra of 2 μm or less. In a case where the surface roughness is more than 2 μm, even when the followability of the transparent resin composition for sealing an organic EL element itself is high, it is highly likely that the sealing layer 3 will insufficiently follow the surface of the target to be glued. Therefore, when the surface roughness is within an appropriate range, the sealing layer 3 closely fits to the target to be glued, so that the visibility is improved. The surface roughness of the target to be glued may be varied by polishing or treating the surface, and the surface roughness of the sealing layer 3 may be modified by changing the surface roughness of a cooling roll in forming the sealing layer 3 in a film shape or changing the surface roughness of the releasing film 4.

The resin sheet for sealing an organic electroluminescence element 1 may have two or more sealing layers 3, or may have a layer in addition to the sealing layer 3.

<Method of Application>

Next, a description is made of a method of application of the resin sheet for sealing an organic electroluminescence element 1.

The resin sheet for sealing an organic electroluminescence element 1 according to the present invention is used to produce various organic electronic devices having solid closely fitted and sealed structures, such that between the organic EL element 6 provided on an element board 5 (see FIGS. 2 and 3A to 3D) and a sealing board 8 (see FIGS. 2 and 3A to 3D) is placed, in which the organic EL element 6 is airtightly sealed with the element board 5 and the sealing board 8. The organic electronic device includes an organic EL display, organic EL illumination, organic semiconductor, organic solar battery, and the like.

Hereinafter, a description is made of the organic EL display (the apparatus for displaying an image) as an example of an organic electronic device. The organic EL display 10 has such a structure as shown in FIG. 2 that the organic EL element 6 provided on the element board 5 is stored in a housing 9 so as to be sealed with the sealing board 8 via a transparent resin layer for sealing an organic EL element 7.

Figure 2:
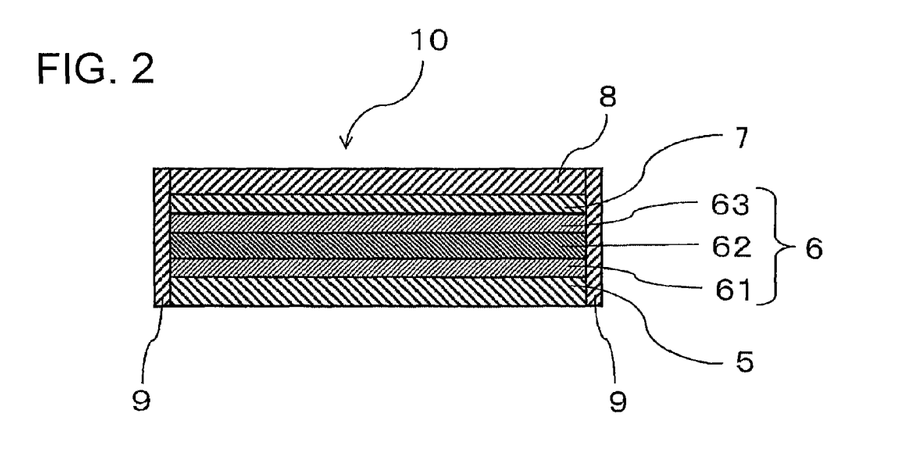
FIG. 2 illustrates a cross sectional view for schematically representing a structure of an apparatus for displaying an image using a resin sheet for sealing an organic electroluminescence element according to an embodiment of the present invention.

The organic EL element 6 has, for example, such a structure as shown in FIG. 2 that on the element board 5 composed of a glass board or the like are provided an anode 61 that is formed by patterning an electroconductive material, an organic layer 62, stacked over the top surface of the anode 61, that is a thin film made of an organic compound material, and a cathode 63, stacked over the top surface of the organic layer 62, that is formed by patterning an electroconductive material having a transparency. In addition, parts of the anode 61 and the cathode 63 are drawn to the end of the element board 5, and connected to a driving circuit (not shown). The organic layer 62 has a hole injecting layer, hole transporting layer, light emitting layer and electron transporting layer so as to be layered in the order thereof from a side of the anode 61, and the light emitting layer has a blue light emitting layer, green light emitting layer and red light emitting layer so as to be layered. In addition, the light emitting layer may have a non-light emitting interlayer between the respective blue, green and red light emitting layers.

The sealing board 8 may be of any material as long as it does not significantly inhibit the visibility of a content displayed on the organic EL display 10, and as the material, for example, glass, resin and the like may be used.

Figure 3A:
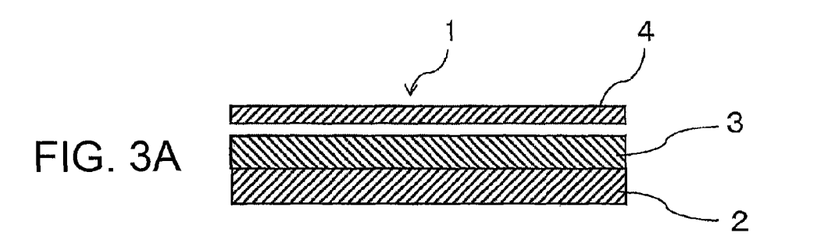
FIGS. 3A to 3D illustrate views for schematically representing a usage example of a resin sheet for sealing an organic electroluminescence element according to an embodiment of the present invention.
Figure 3B:
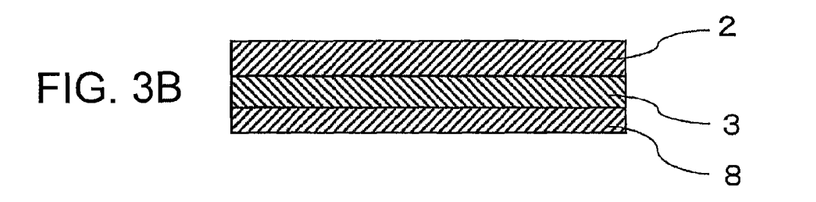
Figure 3C:
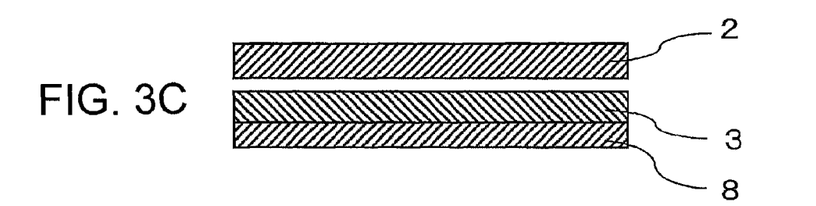
Figure 3D:
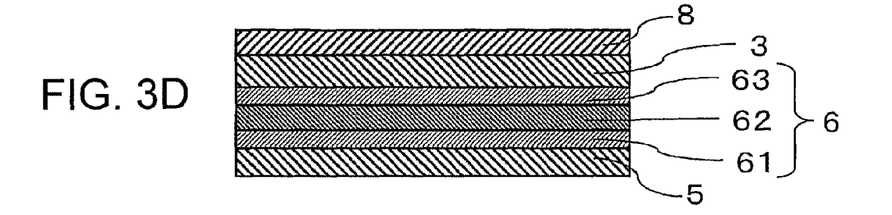

The transparent resin layer for sealing an organic EL element 7 is formed with the use of the above mentioned resin sheet for sealing an organic electroluminescence element 1, and may be produced through the following steps. First of all, as shown in FIG. 3A, the releasing film 4 of the resin sheet for sealing an organic electroluminescence element 1 is peeled off, and as shown in FIG. 3B, the sealing layer 3 is roll glued onto the sealing board 8. Next, as shown in FIG. 3C, the substrate sheet 2 of the resin sheet for sealing an organic electroluminescence element 1 glued onto the sealing board 8 is peeled off. Subsequently, as shown in FIG. 3D, the sealing layer 3 of the resin sheet for sealing an organic electroluminescence element 1 glued onto the sealing board 8 is laminated onto a side of the cathode 63 of the organic EL element 6. Of the sealing layer 3 of the resin sheet for sealing an organic electroluminescence element 1, the transparent resin layer for sealing an organic EL element 7 in the organic EL display 10 is composed.

The above mentioned gluing and laminating are preferably performed at a temperature of 100° C. or less. When the temperature is more than 100° C., the component material of the organic EL element 6 deteriorates, so that the light emitting property may decrease.

In addition, in the above mentioned step for forming the transparent resin layer for sealing an organic EL element 7, although at first the resin sheet for sealing an organic electroluminescence element 1 is roll glued onto the sealing board 8, the resin sheet for sealing an organic electroluminescence element 1 may be glued onto the organic EL element 6 instead. In this case, the substrate sheet 2 of the resin sheet for sealing an organic electroluminescence element 1 is peeled off, and subsequently the sealing layer 3 is to be laminated onto the sealing board 8.

Hereinafter, a more detailed description is made of the structure of the present invention based on Examples, however, the present invention is not to be limited thereto.

EXAMPLES

Example 1

Twenty parts by weight of a styrene-ethylene-isoprene-styrene resin (made by Kuraray Co., Ltd., Septon S2002, a styrene content rate of 30%) as a thermoplastic resin, 70 parts by weight of a C-9 hydrogenated petroleum resin (made by Arakawa Chemical Industries, Ltd., Arkon P100, a softening point of 100° C.) as a tackifying resin, 5 parts by weight of ethyl acetoacetate aluminum diisopropylate (made by Kawaken Fine Chemicals Co., Ltd., ALCH, an Al content of 9.8%) as a desiccating agent, and polybutene (made by JX Nippon Oil & Energy Corporation, Nisseki Polybutene HV-100, a kinetic viscosity at 40° C. of 9500 mm$^2$/s) as a plasticizing agent were used.

The above mentioned thermoplastic resin component was adjusted so as to have a solid content of 20% by weight in toluene, and stirred and dissolved therein, with the result that the thermoplastic resin solution was prepared. After the above mentioned tackifying resin, desiccating agent and plasticizing agent were added in the thermoplastic resin solution, the resultant solution was adjusted so as to have a solid content of 30% by weight with toluene, and mixed and stirred so as to be into a uniform state, with the result that the resin mixed solution was obtained.

To the surface for peeling-off of a polyester film treated to facilitate peeling-off having a thickness of 50 μm (made by Teijin DuPont Films Japan Limited, Purex A-314) as a substrate sheet, the above mentioned resin mixed solution obtained was applied so as to have a thickness of 50 μm, and then heated to 130° C. and dried for 3 minutes, with the result that a sealing layer was formed. The surface of the dried sealing layer was laminated with the surface for peeling-off of the polyester film treated to facilitate peeling-off being of 25 μm (made by TOYOBO CO., LTD, Toyobo ester film E7006) as a releasing film, with the result that a transparent resin sheet for sealing an organic EL element having a uniform thickness according to Example 1 was prepared.

Examples 2 to 13

Transparent resin sheets for sealing an organic EL element according to Examples 2 to 13 were prepared in the same way as described in Example 1 except that the formulation was changed as indicated in Table 1.

Comparative Example 1 to 13

Transparent resin sheets for sealing an organic EL element according to Comparative Examples 1 to 13 were prepared in the same way as described in Example 1 except that the formulation was changed as indicated in Table 2. In Comparative Examples 4 and 6, because gelation occurred in the mixed and stirred resin mixed solutions, it was impossible to perform the subsequent film formation.

(Materials)
<Thermoplastic Resin>

A1: Septon 52002 (made by Kuraray Co., Ltd.: a hydrogenated styrene-ethylene-propylene-styrene copolymer)

A2: Tuftec H1041 (made by Asahi Kasei Chemicals Corporation: a hydrogenated styrene-ethylene-butylene-styrene copolymer)

A3: Tuftec M1913 (made by Asahi Kasei Chemicals Corporation: a hydrogenated styrene-ethylene-butylene-styrene copolymer, acid-modified)

A4: Septon 54033 (made by Kuraray Co., Ltd.: a hydrogenated styrene-ethylene-ethylene-propylene-styrene copolymer)

A5: SIBSTAR 103T (made by Kaneka Corporation: a hydrogenated styrene-isobutylene-styrene copolymer)

A6: Quintac 3280 (made by Zeon Corporation: a styrene-isoprene-styrene copolymer)

A7: JSR TR2601 (made by JSR Corporation: a styrene-butadiene-styrene copolymer)

A8: Oppanol B 15 SFN (made by BASF Japan Ltd.: polyisobutylene)

<Tackifying Resin>

B1: Arkon P100 (made by Arakawa Chemical Industries, Ltd.: a C-9 hydrogenated petroleum resin)

B2: I-MARV P100 (made by Idemitsu Kosan Co., Ltd.: a C-5/C-9 hydrogenated petroleum resin)

B3: Petcoal 100T (made by Tosoh Corporation: a C-9 petroleum resin)

B4: Pinecrystal KE311 (made by Arakawa Chemical Industries, Ltd.: a hydrogenated rosin ester)

B5: Clearon P150 (made by Yasuhara Chemical CO., LTD.: hydrogenated terpene resin)

<Desiccating Agent>

C1: ALCH (made by Kawaken Fine Chemicals Co., Ltd.: a compound represented by the following chemical formula (Chemical Formula 2), a molecular weight of 274)

C2: Chelope EH-2 (made by Hope Chemical Co., Ltd.: a compound represented by the following chemical formula (Chemical Formula 3), a molecular weight of 438)

C3: Chelope C10-2 (made by Hope Chemical Co., Ltd.: a compound represented by the following chemical formula (Chemical Formula 4), a molecular weight of 470)

C4: Alumichelate M (made by Kawaken Fine Chemicals Co., Ltd.: a compound represented by the following chemical formula (Chemical Formula 5), a molecular weight of 490)

<Plasticizing Agent>

D1: Nisseki Polybutene HV-100 (made by JX Nippon Oil & Energy Corporation: polybutene)

(Evaluation Method)

Evaluation was performed in accordance with the following evaluation methods. The results are shown in Tables 1 and 2.

<Acid Value>

After the resin composition mixed solution except the desiccating agent was adjusted so as to have a solid content of 30% by weight with toluene, neutralization titration was performed with respect to 1 g of each acid modified resin with the use of sodium methoxide ($CH_3ONa$), and the mass (mg) of sodium methoxide ($CH_3ONa$) used was measured as the acid value.

<AM/Y>

When the acid value ($mgCH_3ONa/g$) of the transparent resin composition for sealing an organic EL element was represented as A, the molecular weight of the desiccating agent was represented as M, and the weight ratio of the desiccating agent with respect to 100 parts by weight of the resin components was represented as Y, AM/Y was calculated.

[Chemical Formula 2]

[Chemical Formula 3]

[Chemical Formula 4]

[Chemical Formula 5]

<Solution Stability>

After the mixed and stirred resin mixed solution containing all the components was placed at 23° C. for 1 hour, the presence or absence of gelation was evaluated by the visual observation when the solution was filtered through a stainless steel mesh having a wire diameter of 0.6 mm and 16 mesh. The solution having the gelled product found on the mesh was judged as X, and the solution not having the gelled product found thereon was judged as ○.

<Light Transmittance>

The light transmittance of the transparent resin composition for sealing an organic EL element was obtained with the use of a spectrophotometer (made by Hitachi High-Technologies Corporation, spectrophotometer type U-4100, solid sample measuring system). Specifically, the transparent resin sheet for sealing an organic EL element was produced through gluing at 80° C. and adjusting so as to have a thickness of 0.1 mm, and the amount of a transmitted light being of 550 nm at 25° C. was obtained.

<Adhesive Force>

The polyester film treated to facilitate peeling-off being of 25 μm of the adjusted transparent resin sheet for sealing an organic EL element was peeled off, onto which a polyester film treated to facilitate easy adhesion being of 38 μm (made by Teijin DuPont Films Japan Limited, G2-C) was glued at 80° C., and subsequently the polyester film treated to facilitate peeling-off being of 50 μm was peeled off, with the result that a test piece was obtained. To the surface of the sealing layer of the obtained test piece, a glass in conformity with JIS R 3202 as an adherend was glued at a gluing temperature of 80° C., and the test piece was peeled off from the adherend in accordance with a 180° peeling method in conformity with JIS Z 0237, so that the adhesive force was evaluated.

<Retention Force>

A test piece was produced in the same way as described in the above mentioned adhesive force evaluation. To the surface of the sealing layer of the obtained test piece, a glass in conformity with JIS R 3202 as an adherend was glued at a gluing temperature of 80° C., and a prescribed weight in conformity with JIS Z 0237 was attached, so that the sifted distance after 24 hours passed at 100° C. was evaluated as the retention force. In addition, the test piece that had been peeled off within 24 hours was judged as ">25".

<Dark Spot>

On an element board made of an insulating transparent glass was produced the organic EL element including an anode, on the top surface of which was placed the organic layer, on the further top surface of which was placed a cathode. Next, the polyester film treated to facilitate peeling-off being of 25 μm of the adjusted transparent resin sheet for sealing an organic EL element was peeled off, which was then placed on the top surface of the above mentioned cathode of the above mentioned organic EL element. Subsequently, the polyester film treated to facilitate peeling-off being of 50 μm of the transparent resin sheet for sealing an organic EL element was peeled off, and an insulating transparent glass as a sealing board was placed on the top surface of the sealing layer of the transparent resin sheet for sealing an organic EL element, which were exposed to a reduced pressure at 80° C. and pressurized under a pressure of 0.6 MPa for 1 minute, with the result that a model of an organic EL display was produced.

Next, the above mentioned model was treated at 80° C. under 85% RH for 500 hours, and then cooled to a room temperature (25° C.), after which the organic EL element was activated, and observation of a dark spot (a non-light emitting point) was performed. A case of the dark spot area less than 5% with respect to the whole area was judged as "○", meaning an excellent suppression of the dark spot generation, whereas a case of the dark spot area equal to or more than 5% was judged as "X", meaning a poor suppression of the dark spot generation.

TABLE 1

|  |  | EXAMPLE 1 | EXAMPLE 2 | EXAMPLE 3 | EXAMPLE 4 | EXAMPLE 5 | EXAMPLE 6 | EXAMPLE 7 |
|---|---|---|---|---|---|---|---|---|
| THERMOPLASTIC RESIN A [PART BY WEIGHT] | A1 | 20 | 20 |  |  |  |  |  |
|  | A2 |  |  | 20 |  | 10 |  |  |
|  | A3 |  |  |  | 20 | 10 |  |  |
|  | A4 |  |  |  |  |  | 20 |  |
|  | A5 |  |  |  |  |  |  | 20 |
|  | A6 |  |  |  |  |  |  |  |
|  | A7 |  |  |  |  |  |  |  |
|  | A8 |  |  |  |  |  |  |  |
| TACKIFYING RESIN B [PART BY WEIGHT] | B1 | 70 |  | 70 | 70 | 70 | 70 | 70 |
|  | B2 |  | 70 |  |  |  |  |  |
|  | B3 |  |  |  |  |  |  |  |
|  | B4 |  |  |  |  |  |  |  |
|  | B5 |  |  |  |  |  |  |  |
| DESICCATING AGENT C [PART BY WEIGHT] | C1 | 5 | 5 | 5 | 5 | 5 | 5 | 5 |
|  | C2 |  |  |  |  |  |  |  |
|  | C3 |  |  |  |  |  |  |  |
|  | C4 |  |  |  |  |  |  |  |
| PLASTICIZING AGENT D [PART BY WEIGHT] | D1 | 10 | 10 | 10 | 10 | 10 | 10 | 10 |
| ACID VALUE [mgCH$_3$ONa/g] |  | 0.0 | 0.0 | 0.0 | 2.0 | 1.0 | 0.0 | 0.0 |
| AM/Y |  | 0 | 0 | 0 | 110 | 55 | 0 | 0 |
| LIGHT TRANSMITTANCE [%] |  | 92 | 92 | 92 | 90 | 91 | 92 | 92 |
| SOLUTION STABILITY |  | ○ | ○ | ○ | ○ | ○ | ○ | ○ |
| ADHESIVE FORCE [N/25 mm] |  | 10 | 11 | 9.5 | 17 | 15 | 11 | 12 |

TABLE 1-continued

|  |  |  |  |  |  |  |
|---|---|---|---|---|---|---|
| RETENTION FORCE [mm] | 3 | 2.7 | 3 | 3.3 | 3.3 | 4 | 3.8 |
| DARK SPOT | ○ | ○ | ○ | ○ | ○ | ○ | ○ |

|  |  | EXAMPLE 8 | EXAMPLE 9 | EXAMPLE 10 | EXAMPLE 11 | EXAMPLE 12 | EXAMPLE 13 |
|---|---|---|---|---|---|---|---|
| THERMOPLASTIC RESIN A [PART BY WEIGHT] | A1 | 30 | 20 | | | | |
| | A2 | | | | | | |
| | A3 | | | 20 | 20 | 20 | 20 |
| | A4 | | | | | | |
| | A5 | | | | | | |
| | A6 | | | | | | |
| | A7 | | | | | | |
| | A8 | | | | | | |
| TACKIFYING RESIN B [PART BY WEIGHT] | B1 | 50 | 70 | 70 | 70 | 70 | 70 |
| | B2 | | | | | | |
| | B3 | | | | | | |
| | B4 | | | | | | |
| | B5 | | | | | | |
| DESICCATING AGENT C [PART BY WEIGHT] | C1 | 5 | | | 3.5 | 10 | 3.4 |
| | C2 | | 10 | 10 | | | |
| | C3 | | | | | | |
| | C4 | | | | | | |
| PLASTICIZING AGENT D [PART BY WEIGHT] | D1 | 20 | 10 | 10 | 10 | 10 | 10 |
| ACID VALUE [mgCH$_3$ONa/g] | | 0.0 | 0.0 | 2.0 | 2.0 | 2.0 | 2.0 |
| AM/Y | | 0 | 0 | 88 | 157 | 55 | 161 |
| LIGHT TRANSMITTANCE [%] | | 92 | 90 | 88 | 90 | 88 | 90 |
| SOLUTION STABILITY | | ○ | ○ | ○ | ○ | ○ | ○ |
| ADHESIVE FORCE [N/25 mm] | | 14 | 11.5 | 18 | 15 | 18.5 | 15 |
| RETENTION FORCE [mm] | | 4.5 | 2.5 | 3 | 3.2 | 2.7 | 3.2 |
| DARK SPOT | | ○ | ○ | ○ | ○ | ○ | ○ |

TABLE 2

|  |  | COMPARATIVE EXAMPLE 1 | COMPARATIVE EXAMPLE 2 | COMPARATIVE EXAMPLE 3 | COMPARATIVE EXAMPLE 4 | COMPARATIVE EXAMPLE 5 | COMPARATIVE EXAMPLE 6 | COMPARATIVE EXAMPLE 7 |
|---|---|---|---|---|---|---|---|---|
| THERMOPLASTIC RESIN A [PART BY WEIGHT] | A1 | | | | | 20 | 20 | 20 |
| | A2 | | | | | | | |
| | A3 | | | | 20 | | | |
| | A4 | | | | | | | |
| | A5 | | | | | | | |
| | A6 | 20 | | | | | | |
| | A7 | | 20 | | | | | |
| | A8 | | | 30 | | | | |
| TACKIFYING RESIN B [PART BY WEIGHT] | B1 | 70 | 70 | 70 | 70 | | | |
| | B2 | | | | | | | |
| | B3 | | | | | 70 | | |
| | B4 | | | | | | 70 | |
| | B5 | | | | | | | 70 |
| DESICCATING AGENT C [PART BY WEIGHT] | C1 | 5 | 5 | 5 | 3 | 5 | 5 | 5 |
| | C2 | | | | | | | |
| | C3 | | | | | | | |
| | C4 | | | | | | | |
| PLASTICIZING AGENT D [PART BY WEIGHT] | D1 | 10 | 10 | | 10 | 10 | 10 | 10 |

TABLE 2-continued

| | | | | | | | |
|---|---|---|---|---|---|---|---|
| ACID VALUE [mgCH$_3$ONa/g] | 0.0 | 0.0 | 0.0 | 2.0 | 0.0 | 7.0 | 0.0 |
| AM/Y | 0 | 0 | 0 | 183 | 0 | 384 | 0 |
| LIGHT TRANSMITTANCE [%] | 81 | 83 | 92 | — | 82 | — | 92 |
| SOLUTION STABILITY | ○ | ○ | ○ | X | ○ | X | ○ |
| ADHESIVE FORCE [N/25 mm] | 11.5 | 10 | 9 | — | 10 | — | 8.5 |
| RETENTION FORCE [mm] | 3.5 | 3.5 | >25 | — | 3 | — | 4 |
| DARK SPOT | X | X | X | — | ○ | — | X |

| | | COMPARATIVE EXAMPLE 8 | COMPARATIVE EXAMPLE 9 | COMPARATIVE EXAMPLE 10 | COMPARATIVE EXAMPLE 11 | COMPARATIVE EXAMPLE 12 | COMPARATIVE EXAMPLE 13 |
|---|---|---|---|---|---|---|---|
| THERMOPLASTIC RESIN A [PART BY WEIGHT] | A1 | 20 | 20 | 20 | | 50 | |
| | A2 | | | | | | |
| | A3 | | | | | | 20 |
| | A4 | | | | | | |
| | A5 | | | | | | |
| | A6 | | | | | | |
| | A7 | | | | | | |
| | A8 | | | | | | |
| TACKIFYING RESIN B [PART BY WEIGHT] | B1 | 70 | 70 | 70 | 80 | | 70 |
| | B2 | | | | | | |
| | B3 | | | | | | |
| | B4 | | | | | | |
| | B5 | | | | | | |
| DESICCATING AGENT C [PART BY WEIGHT] | C1 | | | | 5 | 5 | 3.36 |
| | C2 | | | | | | |
| | C3 | | 5 | | | | |
| | C4 | | | 5 | | | |
| PLASTICIZING AGENT D [PART BY WEIGHT] | D1 | 10 | 10 | 10 | 20 | 50 | 10 |
| ACID VALUE [mgCH$_3$ONa/g] | | 0.0 | 0.0 | 0.0 | 0.0 | 0.0 | 2.0 |
| AM/Y | | — | 0 | 0 | 0 | 0 | 163 |
| LIGHT TRANSMITTANCE [%] | | 92 | 70 | 50 | 92 | 91 | — |
| SOLUTION STABILITY | | ○ | ○ | ○ | ○ | ○ | X |
| ADHESIVE FORCE [N/25 mm] | | 9 | 10 | 10 | 0.2 | 4 | — |
| RETENTION FORCE [mm] | | 3.5 | 3 | 3 | >25 | >25 | — |
| DARK SPOT | | X | ○ | ○ | X | X | — |

Examples 1 to 13 included as essential components the thermoplastic resin, tackifying resin and organic metallic compound represented by the chemical formula (Chemical Formula 1), had a light transmittance of 85% or more through a thickness of 0.1 mm for a light having a wavelength of 550 nm, had a relationship of AM/Y<162, and contained the hydride of a styrene-based A-B-A type triblock included in the thermoplastic resin, so that all properties involving the solution stability, adhesive force, retention force and dark spot exhibited excellent results.

In contrast, the styrene-based A-B-A type triblock in Comparative Examples 1 and 2 was not hydrogenated, so that the antiweatherability was so low that a dark spot was generated, and also the light transmittance became less than 85%. In addition, the thermoplastic resin in Comparative Example 3 was not a styrene triblock, so that the cohesion force was low and the retention power was inferior, leading to the shift of the sealing board and exposure of the organic EL element in a dark spot test atmosphere (85° C., 850), with the result that a dark spot was generated. Comparative Examples 4, 6 and 13 had an AM/Y of 162 or more, so that the varnish of the transparent resin composition for sealing an organic EL element was gelated, which made the formation of a sheet impossible. The tackifying resin in Comparative Example 5 was not hydrogenated, so that the transparency decreased and the light transmittance was less than 85%. The organic metallic compound represented by the chemical formula (Chemical Formula 1) was not included in Comparative Example 8, so that the growth of a dark spot was found. The carbon number of the organic metallic compound in comparative Examples 9 and 10 had more than eight, so that the transparency decreased and the light transmittance was below 85%. The thermoplastic resin was not included in Comparative Example 11, so that the adhesive force and retention force were low, leading to the shift of the sealing board and exposure of the organic EL element in a dark spot test atmosphere, with the result that a dark spot was generated. The tackifying resin was not included in Comparative Example 12, so that the cohesion force was low and the retention power was inferior, leading to the shift of the sealing board and exposure of the organic EL element in a dark spot test atmosphere, with the result that a dark spot was generated.

REFERENCE SIGNS LIST

1: resin sheet for sealing an organic electroluminescence element
2: substrate sheet
3: sealing layer
4: releasing film
5: element board
6: organic EL element
61: anode
62: organic layer
63: cathode
7: transparent resin layer for sealing an organic EL element
8: sealing board
9: housing
10: organic EL display

The invention claimed is:

1. A transparent resin composition, comprising:
a thermoplastic resin;
a tackifying resin; and
an organic metallic compound represented by formula (1),
having a light transmittance of 85% or more through a thickness of 0.1 mm for a light having a wavelength of 550 nm, and
having a relationship of AM/Y <162,
wherein
A is the acid value (mgCH$_3$ONa/g) of the resin composition excluding the organic metallic compound of formula (1),
M is the weight average molecular weight of the organic metallic compound of formula (1), and
Y is the weight ratio of the organic metallic compound of formula (1) with respect to 100 parts by weight of resin components, wherein Y is from 3.4 to 10,
wherein the thermoplastic resin contains a hydride of a styrene-based A-B-A triblock polymer, Formula (1)

wherein
R1 to R4 independently represent an organic group selected from the group consisting of an alkyl group, aryl group, alkoxy group, cycloalkyl group and acyl group, each having a carbon number of 1 or more and 8 or less,
M represents a metal atom having 3 valency, and
R1 to R4 may be the same or different organic groups to each other.

2. The transparent resin composition according to claim 1, wherein the styrene-based A-B-A triblock polymer is at least one selected from the group consisting of a styrene-ethylene-butylene-styrene copolymer, styrene-ethylene-propylene-styrene copolymer, styrene-ethylene-ethylene-propylene-styrene copolymer and styrene-isobutylene-styrene copolymer.

3. The transparent resin composition according to claim 1, wherein the tackifying resin is at least one selected from the group consisting of a hydride of a C-5 petroleum resin, hydride of a C-9 petroleum resin, and hydride of a petroleum resin obtained through copolymerization of a C-5 petroleum resin with a C-9 petroleum resin.

4. The transparent resin composition according to claim 1, wherein the AM/Y is 0 or more and 161 or less.

5. A resin sheet, comprising a sealing layer comprising the transparent resin composition according to claim 1.

6. The transparent resin composition according to claim 1, wherein the weight average molecular weight of the organic metallic compound is from 274 to 490.

7. The transparent resin composition according to claim 1, wherein the acid value (A) is from 0 to 2.0 (mgCH$_3$ONa/g).

8. The transparent resin composition according to claim 1, wherein the organic metallic compound of formula (1) is selected from the group consisting of:

* * * * *